US010553457B2

(12) United States Patent
Isobe

(10) Patent No.: US 10,553,457 B2
(45) Date of Patent: Feb. 4, 2020

(54) SEMICONDUCTOR DEVICE TO SUPPRESS WARPAGE OF THE SEMICONDUCTOR DEVICE

(71) Applicant: SONY CORPORATION, Tokyo (JP)

(72) Inventor: Hiroshi Isobe, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/316,206

(22) PCT Filed: Jun. 16, 2015

(86) PCT No.: PCT/JP2015/067260
§ 371 (c)(1),
(2) Date: Dec. 5, 2016

(87) PCT Pub. No.: WO2015/198911
PCT Pub. Date: Dec. 30, 2015

(65) Prior Publication Data
US 2017/0162404 A1 Jun. 8, 2017

(30) Foreign Application Priority Data

Jun. 26, 2014 (JP) .................................. 2014-131747

(51) Int. Cl.
*H01L 21/56* (2006.01)
*H01L 25/065* (2006.01)
(Continued)

(52) U.S. Cl.
CPC ...... *H01L 21/563* (2013.01); *H01L 23/49838* (2013.01); *H01L 24/12* (2013.01);
(Continued)

(58) Field of Classification Search
CPC .......... H01L 21/563; H01L 2924/3511; H01L 23/49894
See application file for complete search history.

(56) References Cited

U.S. PATENT DOCUMENTS 5,371,328 A 12/1994 Gutierrez et al.
5,864,178 A 1/1999 Yamada et al.
(Continued)

FOREIGN PATENT DOCUMENTS

EP 639857 A1 2/1995
JP 07-66242 A 3/1995
(Continued)

OTHER PUBLICATIONS

English translation of JP2005-302750 A provided by AIPN. Oct. 27, 2005.*
(Continued)

*Primary Examiner* — Stephen M Bradley
(74) *Attorney, Agent, or Firm* — Chip Law Group

(57) ABSTRACT

The present technology relates to a semiconductor device and a method of manufacturing the semiconductor device capable of suppressing warpage of the semiconductor device. A mold release agent 101 is applied to a side surface of an upper chip 11. According to this, when a sealing resin 31 for protecting a bump 21 is applied, the bump 21 between the upper chip 11 and a lower chip 12 is protected and a fillet-shaped protruding portion does not adhere to the side surface of the upper chip 11 due to the mold release agent 101, so that a gap 111 is formed. According to this, a stress to warp the lower chip 12 is not generated even when contraction associated with drying of the sealing resin 31 between the side surface of the upper chip 11 and an upper surface of the lower chip 12 occurs, so that it becomes possible to suppress the warpage. The present technology may be applied to the semiconductor device.

7 Claims, 8 Drawing Sheets

(51) Int. Cl.
  *H01L 25/07* (2006.01)
  *H01L 25/18* (2006.01)
  *H01L 23/498* (2006.01)
  *H01L 23/00* (2006.01)

(52) U.S. Cl.
  CPC ............ *H01L 24/742* (2013.01); *H01L 24/81* (2013.01); *H01L 24/92* (2013.01); *H01L 2924/3511* (2013.01)

(56) References Cited

U.S. PATENT DOCUMENTS

| | | | |
|---|---|---|---|
| 5,959,363 A | 9/1999 | Yamada et al. | |
| 2002/0090162 A1 | 7/2002 | Asada et al. | |
| 2003/0107113 A1* | 6/2003 | Ma | H01L 21/563 257/669 |
| 2011/0001233 A1* | 1/2011 | Iwase | H01L 21/563 257/737 |
| 2011/0020983 A1* | 1/2011 | Tomura | H01L 21/563 438/108 |
| 2013/0137216 A1* | 5/2013 | Ito | H01L 25/0652 438/108 |

FOREIGN PATENT DOCUMENTS

| | | |
|---|---|---|
| JP | 09-172110 A | 6/1997 |
| JP | 2003-92312 A | 3/2003 |
| JP | 2005-302750 A | 10/2005 |
| JP | 2005302750 A * | 10/2005 |
| JP | 2009-26791 A | 2/2009 |
| JP | 2010-50308 A | 3/2010 |
| JP | 2011-119381 A | 6/2011 |
| JP | 2012-28443 A | 2/2012 |
| JP | 2012-238704 A | 12/2012 |
| JP | 2014-91744 A | 5/2014 |
| TW | 201250873 A | 12/2012 |
| TW | 201421621 A | 6/2014 |
| WO | 2012/153846 A1 | 11/2012 |
| WO | 2014/070694 A1 | 5/2014 |

OTHER PUBLICATIONS

International Search Report and Written Opinion of PCT Application No. PCT/JP2015/067260, dated Sep. 1, 2015, 12 pages of English Translation and 10 pages of ISRWO.
International Preliminary Report on Patentability of PCT Application No. PCT/JP2015/067260, dated Dec. 27, 2016, 8 pages.

* cited by examiner

SEMICONDUCTOR DEVICE TO SUPPRESS WARPAGE OF THE SEMICONDUCTOR DEVICE

CROSS REFERENCE TO RELATED APPLICATIONS

This application is a U.S. National Phase of International Patent Application No. PCT/JP2015/067260 filed on Jun. 16, 2015, which claims priority benefit of Japanese Patent Application No. JP 2014-131747 filed in the Japan Patent Office on Jun. 26, 2014. Each of the above-referenced applications is hereby incorporated herein by reference in its entirety.

TECHNICAL FIELD

The present technology relates to a semiconductor device and a method of manufacturing the semiconductor device and especially relates to the semiconductor device and the method of manufacturing the semiconductor device capable of suppressing warpage of the semiconductor device.

BACKGROUND ART

A semiconductor device obtained by flip-chip mounting a semiconductor chip on a circuit substrate is known as a mode of the semiconductor device. In this type of semiconductor device, the circuit substrate and the semiconductor chip are electrically and mechanically connected to each other through a connecting terminal referred to as a bump.

Also, an interval (gap) between the circuit substrate and the semiconductor chip is filled with a sealing resin referred to as an underfill material for protecting the bump being the connecting terminal. The underfill material fills the interval between the circuit substrate and the semiconductor chip by using a capillary phenomenon. At that time, a fillet flaring out at the bottom is formed on an outer periphery of the semiconductor chip, the fillet formed of the underfill material protruding out therefrom.

A thermoset resin such as an epoxy resin is used as the underfill material. Therefore, the underfill material in a liquid state is injected into the interval between the circuit substrate and the semiconductor chip to fill the same and thereafter cured by thermal treatment. At that time, warpage might occur on the circuit substrate by a stress associated with thermal contraction of a fillet-shaped protruding portion of the underfill material. Also, when a reliability test such as a temperature cycling test is carried out, the warpage might occur on the circuit substrate for a similar reason.

Therefore, technology of taking a measure by forming a sunken portion for preventing protrusion of the resin on a lower chip is suggested (refer to Patent Document 1).

Also, technology of reducing the warpage by using several types of sealing resins with different linear expansion coefficients is suggested (refer to Patent Document 2).

Furthermore, technology of reducing the warpage by providing a groove on a lower substrate is suggested (refer to Patent Document 3).

CITATION LIST

Patent Document

Patent Document 1: Japanese Patent Application Laid-Open No. 2010-165814
Patent Document 2: Japanese Patent Application Laid-Open No. 2013-141027
Patent Document 3: Japanese Patent Application Laid-Open No. 10-233465

SUMMARY OF THE INVENTION

Problems to be Solved by the Invention

Meanwhile, a position to which the sealing resin should be applied is essentially a bump portion provided between an upper chip and the lower chip. However, in general, when the sealing resin is applied, this is uniformly applied to an upper surface of the lower chip, but this is applied to a side surface in addition to a bottom surface of the upper chip, so that the sealing resin adheres in a fillet shape between the upper chip and the lower chip. Then, due to thermal contraction of the fillet-shaped sealing resin at the time of curing, a stress is generated between the sealing resin adhered to the side surface of the upper chip and the sealing resin adhered to the upper surface of the lower chip, the warpage occurs in the semiconductor device in association with the stress, so that the chip might be cracked.

Also, although the technology of Patent Document 1 takes a measure by providing the sunken portion for preventing the protrusion of the resin on the lower chip, providing a large sunken portion might increase a cost. Also, when the chip is made thinner in the future, strength of the lower chip might be decreased by the sunken portion itself.

Also, although the technology of Patent Document 2 decreases the warpage by using the sealing resins with the different linear expansion coefficients, the linear expansion coefficient of the resin is correlated with another physical property such as viscosity and elasticity, so that performance other than the warpage might be probably changed and it might not be possible to freely select the same.

Furthermore, the groove is provided on the lower substrate in the technology of Patent Document 3, so that the strength might be similarly decreased when the chip is made thinner.

The present technology is achieved in view of such a condition and an object thereof is especially to suppress the warpage of the semiconductor device by a simple method.

Solutions to Problems

A semiconductor device according to an aspect of the present technology includes an upper semiconductor chip, a lower semiconductor chip, a bump which connects the upper semiconductor chip to the lower semiconductor chip, a sealing resin which protects the bump, and a gap formed between a fillet-shaped area protruding from an area in which the bump is present of the sealing resin and any one of a side surface of the upper semiconductor chip and an upper surface of the lower semiconductor chip.

The gap may be formed by arranging a partition plate in a position between the fillet-shaped area protruding from the area in which the bump is present when the sealing resin is applied and any one of the side surface of the upper semiconductor chip and the upper surface of the lower semiconductor chip before applying the sealing resin, applying the sealing resin, and thereafter removing the partition plate.

The partition plate may be a plate-like member to a portion in contact with the sealing resin of which a mold release agent is applied or a plate-like member formed of a material evaporated or sublimed by heat when the sealing resin is dried.

The gap may be formed between the side surface of the upper semiconductor chip and the fillet-shaped sealing resin.

A mold release agent may be applied to the side surface of the upper semiconductor chip, and the gap may be formed when the fillet-shaped sealing resin is released from the side surface of the upper semiconductor chip by the mold release agent applied to the side surface of the upper semiconductor chip.

The mold release agent may be applied to an upper surface in addition to the side surface of the upper semiconductor chip.

The gap may be formed between the upper surface of the lower semiconductor chip in an area other than an area opposed to the upper semiconductor chip and the fillet-shaped sealing resin.

A mold release agent may be applied to the upper surface of the lower semiconductor chip in the area other than the area opposed to the upper semiconductor chip, and the gap may be formed when the fillet-shaped sealing resin is released from the upper surface of the lower semiconductor chip in the area other than the area opposed to the upper semiconductor chip by the mold release agent applied to the upper surface of the lower semiconductor chip in the area other than the area opposed to the upper semiconductor chip.

A plurality of upper semiconductor chips may be stacked in a state of being connected to each other by bumps and connected to the lower semiconductor chip through the bump, and the gap may be formed between the fillet-shaped sealing resin protruding from the area in which the bump is present and any one of a side surface of a plurality of stacked upper semiconductor chips and the upper surface of the lower semiconductor chip.

A first configuration obtained by stacking a plurality of upper semiconductor chips and a second configuration formed of the upper semiconductor chip, the configuration different from the first configuration in adjacent positions may be connected to the lower semiconductor chip through bumps, and the gap may be formed in an area in which the first configuration and the second configuration are not adjacent to each other, formed between the fillet-shaped sealing resin protruding from the area in which the bump is present and any one of a side surface of the first configuration and the upper surface of the lower semiconductor chip, and between the sealing resin and any one of a side surface of the second configuration and the upper surface of the lower semiconductor chip.

A method of manufacturing a semiconductor device according to an aspect of the present technology is a method of manufacturing a semiconductor device including an upper semiconductor chip, a lower semiconductor chip, a bump which connects the upper semiconductor chip to the lower semiconductor chip, a sealing resin which protects the bump, and a gap formed between a fillet-shaped area protruding from an area in which the bump is present of the sealing resin and any one of a side surface of the upper semiconductor chip and an upper surface of the lower semiconductor chip, the method wherein a process for forming the gap is performed before the sealing resin is applied.

The process for forming the gap is a process of arranging a partition plate in a position between the fillet-shaped area protruding from the area in which the bump is present when the sealing resin is applied and any one of the side surface of the upper semiconductor chip and the upper surface of the lower semiconductor chip, and the partition plate may be removed after the sealing resin is applied.

The partition plate may be a plate-like member to a portion in contact with the sealing resin of which a mold release agent is applied or a plate-like member formed of a material evaporated or sublimed by heat when the sealing resin is dried.

The process for forming the gap may be a process of applying a mold release agent to the side surface of the upper semiconductor chip.

The process for forming the gap may be a process of applying a mold release agent to the upper surface of the lower semiconductor chip in an area which is not opposed to the upper semiconductor chip.

An aspect of the present technology is a semiconductor device including an upper semiconductor chip, and a lower semiconductor chip, wherein a bump connects the upper semiconductor chip to the lower semiconductor chip, a sealing resin protects the bump, and a gap is formed between a fillet-shaped area protruding from an area in which the bump is present and any one of a side surface of the upper semiconductor chip and an upper surface of the lower semiconductor chip.

Effects of the Invention

According to an aspect of the present technology, the warpage of the semiconductor device may be suppressed.

MODE FOR CARRYING OUT THE INVENTION

<Configuration of General Semiconductor Device>

The present technology is technology for suppressing warpage of a semiconductor device. Note that, before describing a configuration of the semiconductor device of the present technology, a configuration of a general semiconductor device is described.

Figure 1:
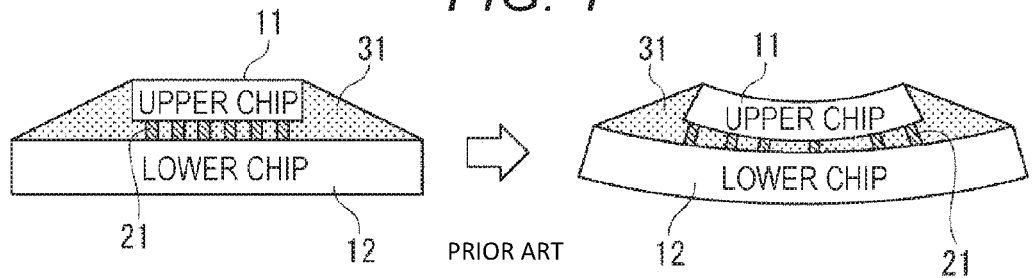
FIG. 1 is a view illustrating a configuration of a general semiconductor device.

The semiconductor device in FIG. 1 is obtained by flip-chip mounting a semiconductor chip (upper chip 11) on a circuit substrate (lower chip 12). In the semiconductor device in FIG. 1, the circuit substrate (lower chip 12) and the semiconductor chip (upper chip 11) are electrically and mechanically connected to each other through a connecting terminal referred to as a bump 21.

Also, an interval (gap) between the circuit substrate (lower chip 12) and the semiconductor chip (upper chip 11) is filled with a sealing resin 31 referred to as an underfill material for protecting the bump 21. The interval between the circuit substrate (lower chip 12) and the semiconductor chip (upper chip 11) is filled with the sealing resin 31 by using a capillary phenomenon. At that time, a fillet flaring out at the bottom is formed on an outer periphery of the semiconductor chip (upper chip 11), the fillet formed of the sealing resin 31 protruding out therefrom as illustrated in a left part of FIG. 1.

Meanwhile, a thermoset resin such as an epoxy resin is used as the sealing resin 31. Therefore, the sealing resin 31 in a liquid state is injected into the interval between the circuit substrate (lower chip 12) and the semiconductor chip (upper chip 11) to fill the same, and thereafter cured by thermal treatment.

At that time, by a stress associated with thermal contraction of a fillet-shaped protruding portion of the sealing resin 31, warpage occurs on both the semiconductor chip (upper chip 11) and the circuit substrate (lower chip 12) as illustrated in a right part of FIG. 1. Furthermore, also when a reliability test such as a temperature cycling test is carried out, the warpage occurs on the circuit substrate for a similar reason.

<Semiconductor Device to which Present Technology is Applied>

Figure 2:
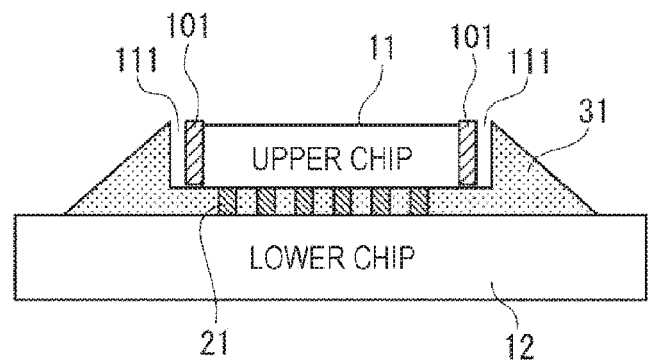
FIG. 2 is a view illustrating a configuration of a semiconductor device to which the present technology is applied.

FIG. 2 illustrates the configuration of the semiconductor device to which the present technology is applied. Note that the configuration having the same function as that of the configuration in FIG. 1 is assigned with the same name and reference numeral; the description thereof is appropriately omitted.

That is to say, the semiconductor device in FIG. 2 is different from the semiconductor device in FIG. 1 in that a mold release agent 101 is applied to a side surface of the upper chip 11. The mold release agent 101 is a fluorine resin and the like, for example, which prevents the applied sealing resin 31 from adhering. The mold release agent 101 is applied to the side surface of the upper chip 11 before the sealing resin 31 is applied, so that when the sealing resin 31 is applied to the bump 21 thereafter, the sealing resin 31 does not adhere to the side surface of the upper chip 11, the sealing resin 31 is not brought into contact with the mold release agent 101, and a gap 111 is provided.

That is to say, as illustrated in FIG. 2, the side surface of the upper chip 11 is not bonded to the sealing resin 31 and the gap 111 is provided therebetween, so that the stress associated with the thermal contraction described above is not generated and it becomes possible to suppress the warpage of the lower chip 12.

<First Variation>

Figure 3:
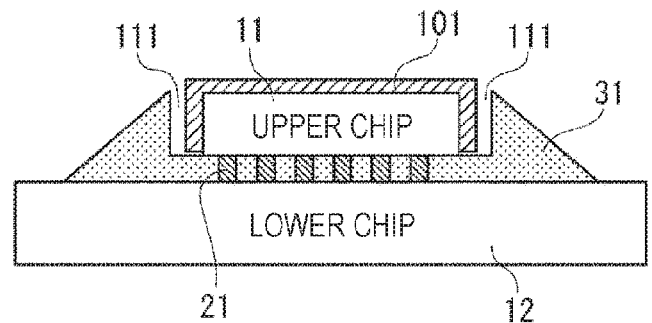
FIG. 3 is a view illustrating a first variation of a semiconductor device to which the present technology is applied.

Although an example in which a mold release agent 101 is applied only to a side surface of an upper chip 11 is heretofore described, it is sufficient that the mold release agent 101 is applied to the side surface, so that the mold release agent 101 may be applied not only to the side surface of the upper chip 11 but also to an upper surface thereof as illustrated in FIG. 3.

Figure 4:
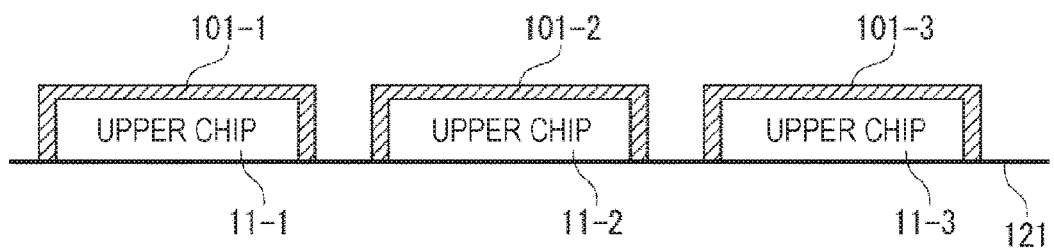
FIG. 4 is a view illustrating a method of manufacturing the semiconductor device in FIG. 3.

By configuring in this manner, it becomes not required to selectively apply the mold release agent 101 only to the side surface of the upper chip 11 in a manufacturing process, so that it becomes possible to apply mold release agents 101-1 to 101-3 diluted with water or an organic solvent to upper chips 11-1 to 11-3 arranged on a dicing table 121 at once as illustrated in FIG. 4, for example, thereby simplifying a working process. Note that, although an example in which three upper chips 11-1 to 11-3 are arranged on the dicing table 121 is illustrated in FIG. 4, the number thereof may be equal to or larger than this.

<First Manufacturing Process>

Figure 5:
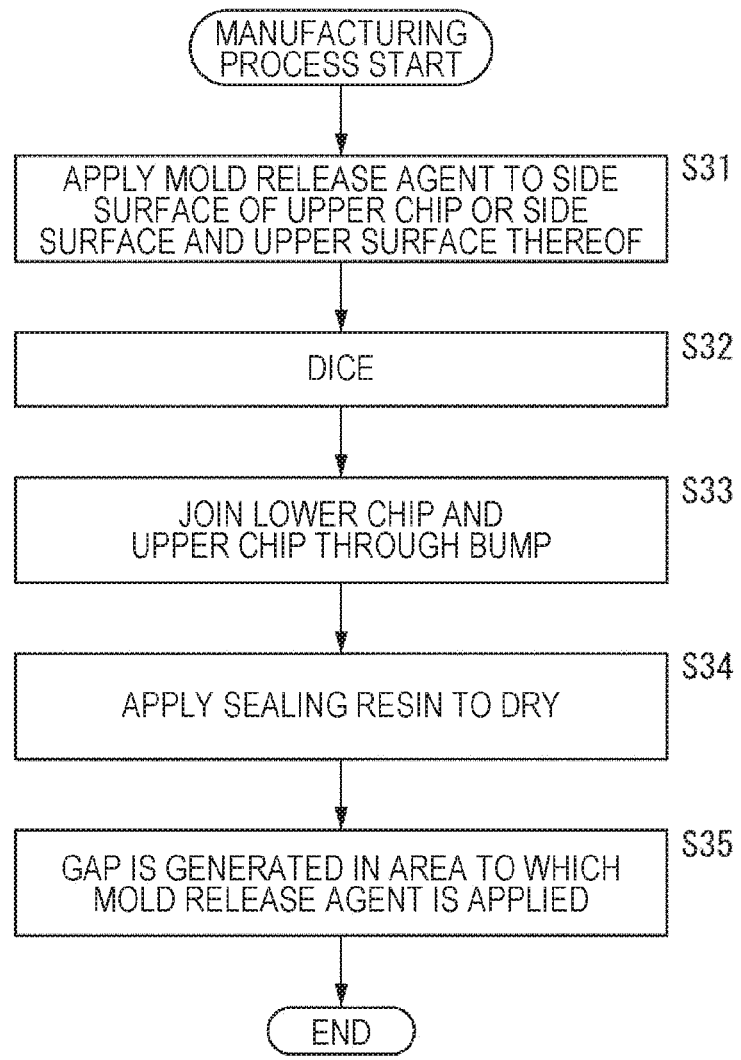
FIG. 5 is a flowchart illustrating a process of manufacturing the semiconductor device in FIGS. 2 and 3.

A first manufacturing process is next described with reference to a flowchart in FIG. 5.

At step S31, the mold release agent 101 is applied only to the side surface of the upper chip 11 arranged on the dicing table 121 as illustrated in FIG. 2 or to the upper surface and the side surface as illustrated in FIGS. 3 and 4.

At step S32, the upper chip 11 is diced to be individually cut.

At step S33, the upper chip 11 and a lower chip 12 are electrically and mechanically connected to each other through a bump 21.

At step S34, a sealing resin 31 is applied to an upper surface of the lower chip 12, impregnated into the bump 21 by a capillary phenomenon, and further dried to be cured into a fillet shape as illustrated in FIG. 2 or 3.

At step S35, the applied sealing resin 31 is prevented from adhering by the mold release agent 101 applied to the side surface of the upper chip 11, so that a gap 111 is formed between the side surface of the upper chip 11 and the sealing resin 31.

By the manufacturing process described above, the fillet-shaped portion formed on the lower chip 12 of the sealing resin 31 impregnated into the bump 21 between the upper chip 11 and the lower chip 12 is prevented from adhering by the mold release agent 101 applied to the side surface of the upper chip 11, so that the gap 111 is provided between the mold release agent 101 and the side surface of the upper chip 11. As a result, as described with reference to FIG. 1, generation of a stress due to contraction associated with drying of the fillet-shaped sealing resin 31 is inhibited, so that warpage of the upper chip 11 and the lower chip 12 is prevented.

<Second Variation>

A configuration example of a semiconductor device in which generation of a stress by a fillet-shaped sealing resin 31 is inhibited by applying a mold release agent 101 to a side surface of an upper chip 11 to prevent the sealing resin 31 from adhering is heretofore described. However, a gap 111 may be provided on any portion of the sealing resin 31 as long as the stress is not generated between the side surface of the upper chip 11 and an upper surface of a lower chip 12 by contraction of the fillet-shaped sealing resin 31. Therefore, for example, it is also possible to apply the mold release agent 101 to the upper surface of the lower chip 12 and configure such that the gap 111 is provided between a bottom surface of the fillet-shaped sealing resin 31 and the upper surface of the lower chip 12 as illustrated in FIG. 6.

<Second Manufacturing Process>

Figure 6:
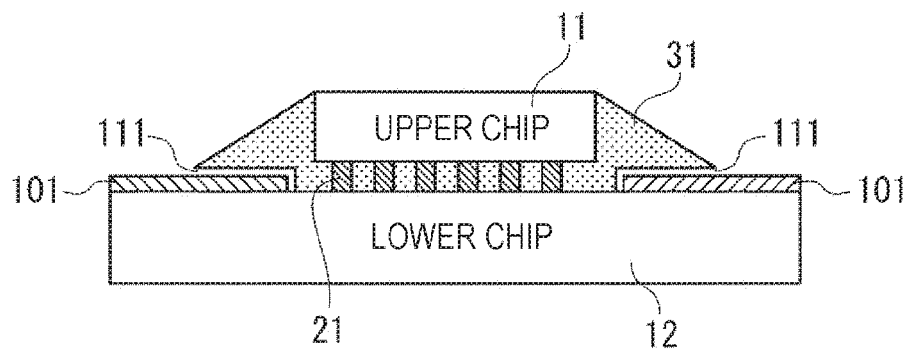
FIG. 6 is a view illustrating a second variation of a semiconductor device to which the present technology is applied.
Figure 7:
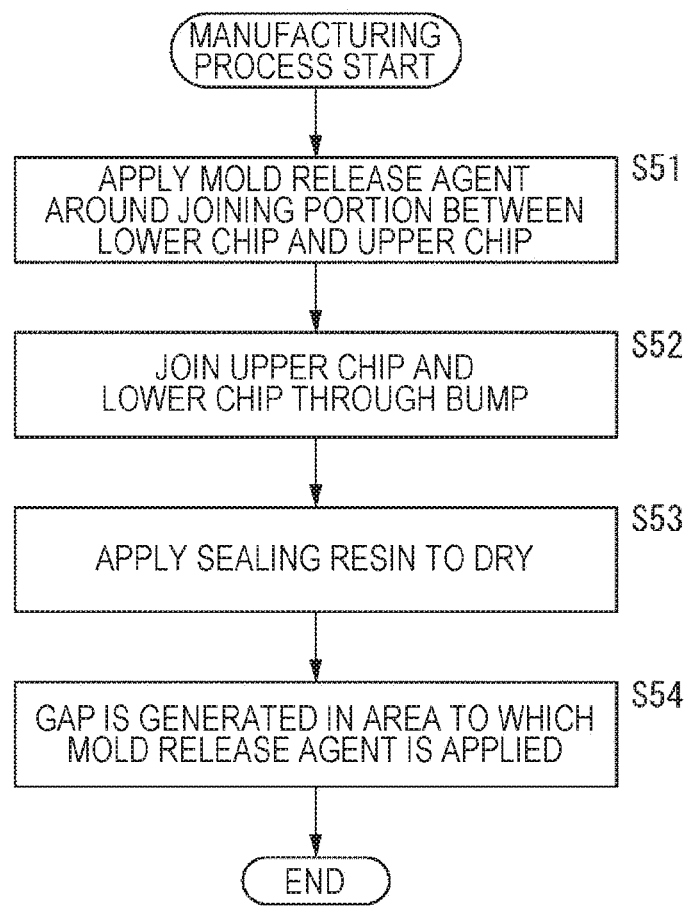
FIG. 7 is a flowchart illustrating a process of manufacturing the semiconductor device in FIG. 6.

A process of manufacturing a semiconductor device in FIG. 6 is next described with reference to a flowchart in FIG. 7.

At step S51, the mold release agent 101 is applied to an area around an area in which a bump 21 is provided, the area which is not opposed to the upper chip 11 on the lower chip 12.

At step S52, the upper chip 11 and the lower chip 12 are electrically and mechanically connected to each other through the bump 21.

At step S53, the sealing resin 31 is applied to the upper surface of the lower chip 12 and on the mold release agent 101, impregnated into the bump 21, and further dried to be cured into the fillet shape.

At step S54, the applied sealing resin 31 is prevented from adhering by the mold release agent 101 applied to the upper surface of the lower chip 12, so that the gap 111 is formed between the area which is not opposed to the upper chip 11 on the upper surface of the lower chip 12 and the sealing resin 31 protruding into the fillet shape from the bump 21 as illustrated in FIG. 6.

By the manufacturing process described above, the fillet-shaped portion formed on the lower chip 12 of the sealing resin 31 impregnated into the bump 21 between the upper chip 11 and the lower chip 12 is prevented from adhering by the mold release agent 101 applied to the upper surface of the lower chip 12 under the same, so that the gap 111 is provided between the mold release agent 101 and the fillet-shaped sealing resin 31. As a result, as described with reference to FIG. 6, the generation of the stress due to the contraction associated with the drying of the fillet-shaped sealing resin 31 is inhibited, so that the warpage of the upper chip 11 and the lower chip 12 is prevented.

<Third Variation>

An example of forming a gap 111 by applying a mold release agent 101 on a side surface of an upper chip 11 and an upper surface of a lower chip 12 is heretofore described. However, another configuration is also possible as long as the gap 111 is formed so as to inhibit generation of a stress due to contraction when a fillet-shaped sealing resin 31 is cured; for example, it is also possible to provide a partition plate to which the mold release agent 101 is applied on any portion of the fillet-shaped sealing resin 31 and remove the same after the sealing resin 31 is cured, thereby forming the gap 111.

Figure 8:
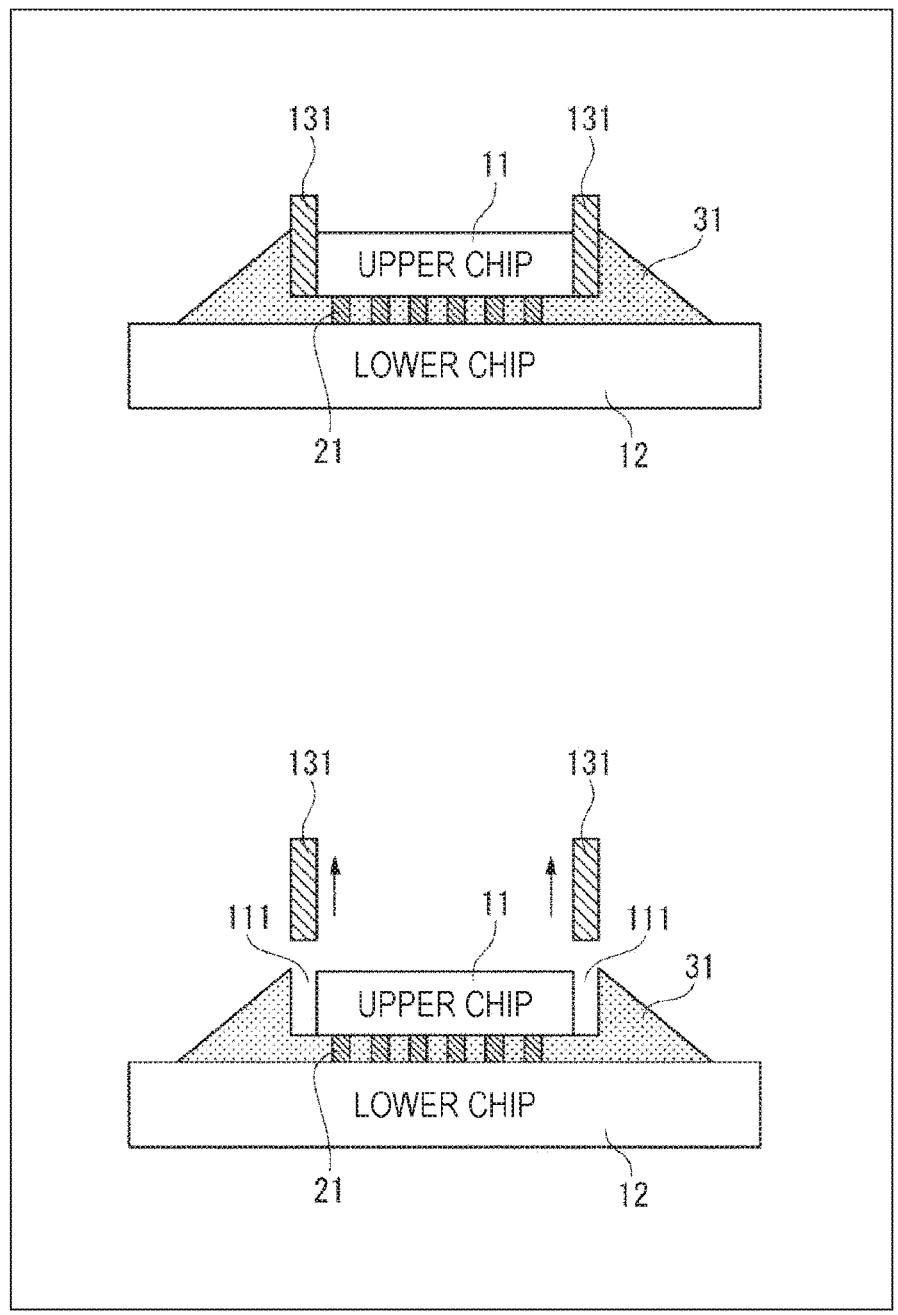
FIG. 8 is a view illustrating a third variation of a semiconductor device to which the present technology is applied.

In more detail, for example, as illustrated in an upper part of FIG. 8, a partition plate 131 to an entire surface (or only a portion which is in contact with the sealing resin 31) of which the mold release agent 101 is applied is adhered so as to cover the side surface of the upper chip 11 and thereafter the sealing resin 31 is applied to be cured. Then, the partition plate 131 is removed in a direction indicated by an arrow in the drawing as illustrated in a lower part of FIG. 8 before the sealing resin 31 is completely cured, thereby forming the gap 111.

Also, in this case, the partition plate 131 is removed as the sealing resin 31 is dried and cured, so that it is also possible that this is formed of paraffin and the like, for example, to be gradually evaporated (or sublimed) as the sealing resin 31 is dried and cured and the gap 111 is formed as a result.

<Third Manufacturing Method>

Figure 9:
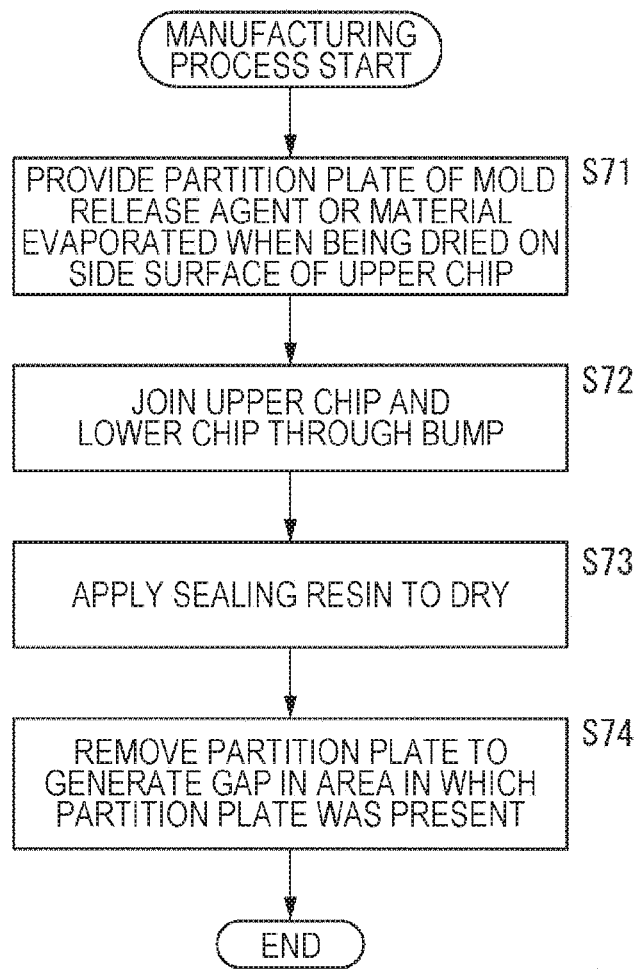
FIG. 9 is a flowchart illustrating a process of manufacturing the semiconductor device in FIG. 8.

A process of manufacturing a semiconductor device in FIG. 8 is next described with reference to a flowchart in FIG. 9.

At step S71, the partition plate 131 to the entire surface (or only the portion which is in contact with the sealing resin 31) of which the mold release agent 101 is applied is provided on the side surface of the upper chip 11.

At step S72, the upper chip 11 and the lower chip 12 are electrically and mechanically connected to each other through a bump 21.

At step S73, the sealing resin 31 is applied to the upper surface of the lower chip 12 and on the mold release agent 101, impregnated into the bump 21, and further dried to be cured into the fillet shape.

At step S74, the partition plate 131 is removed before the sealing resin 31 is completely cured. According to this, the applied sealing resin 31 is such that the gap 111 is formed between the side surface of the upper chip 11 and the sealing resin 31 as illustrated in FIG. 8.

By the manufacturing process described above, the gap 111 is provided between a fillet-shaped protruding portion formed on the lower chip 12 of the sealing resin 31 impregnated into the bump 21 between the upper chip 11 and the lower chip 12 and the side surface of the upper chip 11. As a result, as described with reference to FIG. 8, the generation of the stress due to the contraction associated with the drying of the fillet-shaped sealing resin 31 is inhibited, so that warpage of the upper chip 11 and the lower chip 12 is prevented.

Also, although the example in which the sealing resin 31 is applied between the upper chip 11 and the lower chip 12 in a state in which the partition plate 131 is adhered to the side surface of the upper chip 11 is herein described, it is also possible that the partition plate 131 is provided on the upper surface around an area in which the bump 21 is formed. In this case, the partition plate 131 is removed in a horizontal direction in the drawing and the gap 111 is provided between the fillet-shaped sealing resin 31 and the lower chip 12 as in the case illustrated in FIG. 6.

Furthermore, the partition plate 131 is preferably provided such that the stress generated by the contraction associated with the curing of the fillet-shaped sealing resin 31 formed between the side surface of the upper chip 11 and the upper surface of the lower chip 12 may be inhibited. Therefore, as illustrated in an upper part of FIG. 10, for example, it is also possible to provide the partition plate 131 in a direction at a predetermined angle with respect to a direction of the stress generated by the sealing resin 31 formed into the fillet shape, thereafter apply the sealing resin 31, and as this is dried to be cured, remove the partition plate 131 as illustrated in a lower part of FIG. 10, thereby forming the gap 111.

<Fourth Variation>

Figure 11:
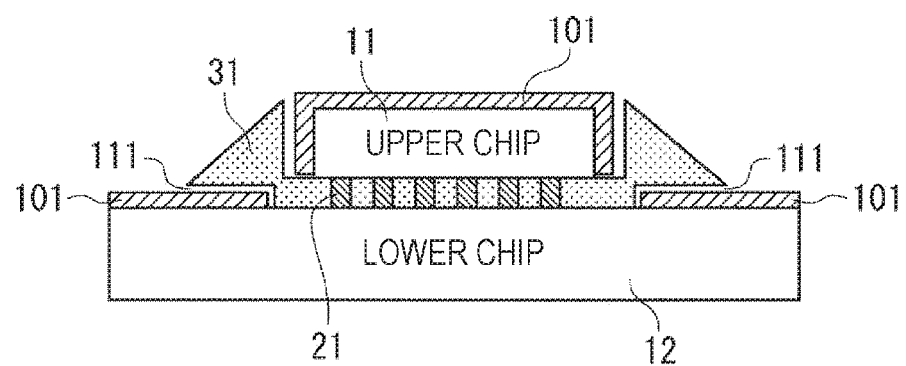
FIG. 11 is a view illustrating a fourth variation of a semiconductor device to which the present technology is applied.

An example of forming one gap 111 at a predetermined angle with respect to a direction in which a stress is generated as a sealing resin 31 formed into a fillet shape is dried to be cured is heretofore described. However, it is sufficient that the gap 111 is provided such that the stress is not generated, so that it is possible to provide not only one but also a plurality of gaps 111; for example, a mold release agent 101 may be applied to an upper surface of a lower chip 12 around an area in which a bump 21 is provided and the mold release agent 101 may be applied to an upper surface and a side surface of an upper chip 11 as illustrated in FIG. 11.

By configuring in this manner, when the sealing resin 31 is applied, the gap 111 is provided between the sealing resin 31 formed into the fillet shape and the side surface of the upper chip 11, and the gap 111 is also provided between the sealing resin 31 and the upper surface of the lower chip 12. As a result, the generation of the stress due to the contraction associated with the drying of the sealing resin 31 is inhibited, so that warpage of the upper chip 11 and the lower chip 12 is inhibited.

<Fifth Variation>

An example in which a mold release agent 101 is applied to an upper surface and a side surface of an upper chip 11 and the mold release agent 101 is further applied to an upper surface of a lower chip 12, an area around a bump 21 is located is heretofore described. However, it is sufficient that generation of a stress is inhibited, so that the generation of the stress may be inhibited by avoiding a sealing resin 31 from being formed into a fillet shape.

Figure 12:
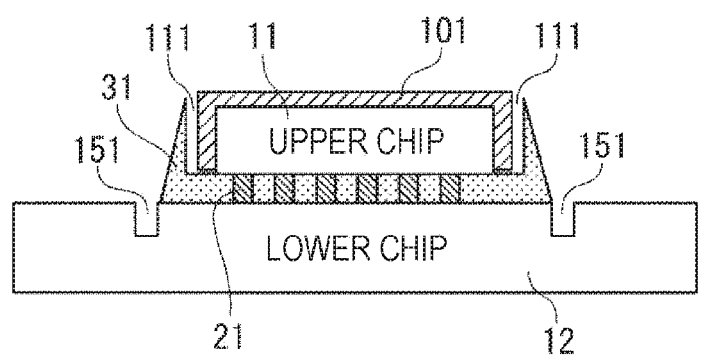
FIG. 12 is a view illustrating a fifth variation of a semiconductor device to which the present technology is applied.

That is to say, for example, as illustrated in FIG. 12, the mold release agent 101 is applied to the upper surface and the side surface of the upper chip 11 and a groove 151 is formed around an area in which the bump 21 is provided on the upper surface of the lower chip 12 such that the sealing resin 31 which is not impregnated into the bump 21 flows in the groove 151. In this manner, a gap 111 is formed between the sealing resin 31 and the side surface of the upper chip 11 and the sealing resin 31 is not formed into the fillet shape, so that the stress generated between the side surface of the upper chip 11 and the upper surface of the lower chip 12 is inhibited, and as a result, warpage of the upper chip 11 and the lower chip 12 is inhibited.

<Sixth Variation>

Although an example in which one upper chip 11 is stacked on a lower chip 12 is heretofore described, a gap 111 is preferably formed so as to inhibit a stress generated by contraction associated with drying and curing of a sealing resin 31 also in a configuration in which a plurality of chips is stacked on the lower chip 12.

Figure 13:
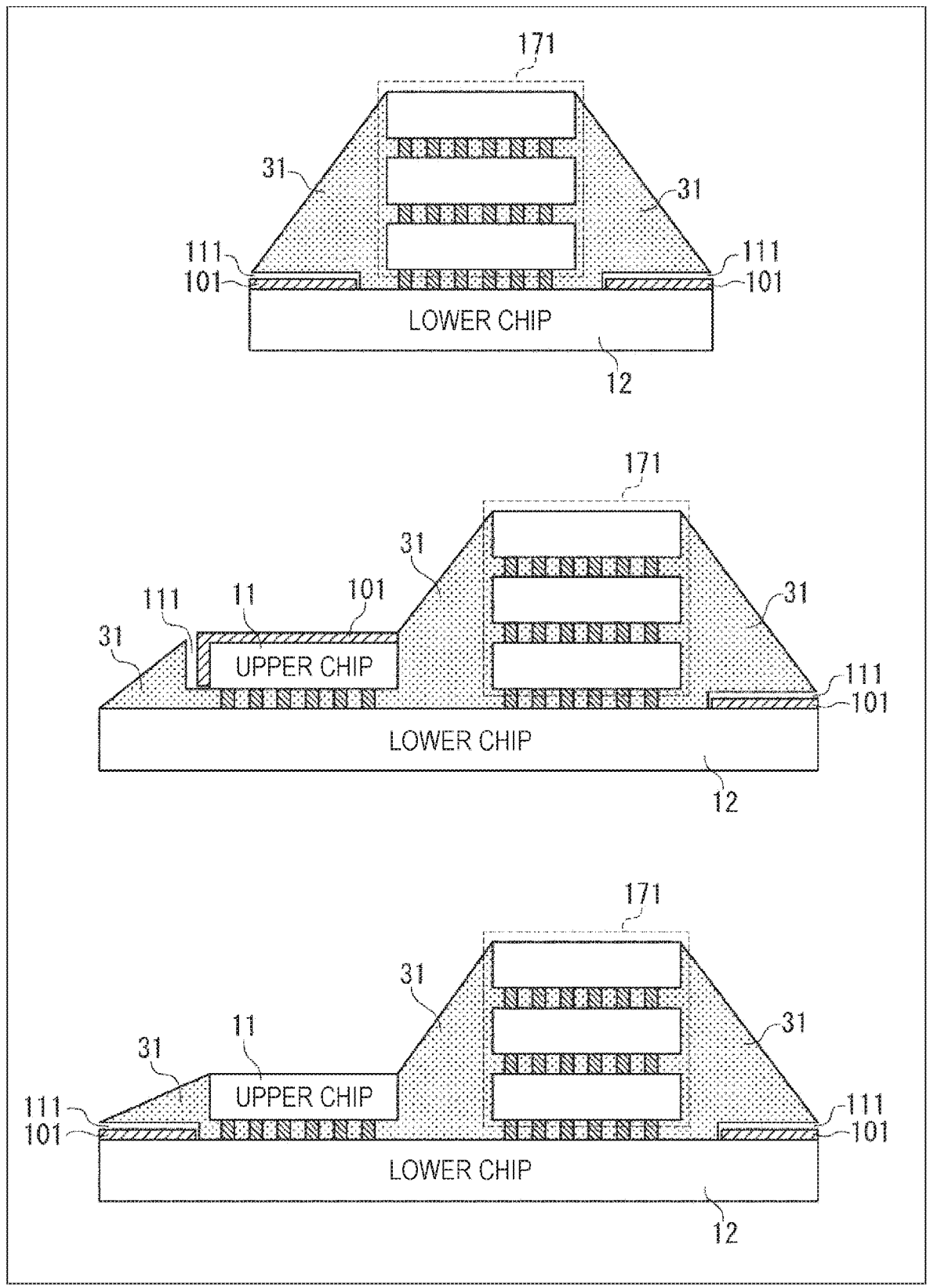
FIG. 13 is a view illustrating a sixth variation of a semiconductor device to which the present technology is applied.

That is to say, for example, when a multi-layer substrate 171 in which upper chips are stacked through bumps 21 is stacked on the lower chip 12 through the bump 21, as illustrated in an upper part of FIG. 13, a mold release agent 101 is applied around the bump 21 on the lower chip 12 and thereafter the sealing resin 31 is applied so as to be impregnated into the bump 21 on a lowest portion of the multi-layer substrate 171. In this manner, the gap 111 is formed between an area around the bump 21 on an upper surface of the lower chip 12 and a fillet-shaped sealing resin 31.

As a result, it becomes possible to inhibit generation of the stress due to the contraction associated with the drying and the curing of the sealing resin 31, so that it becomes possible to inhibit warpage of the lower chip 12. That is to say, a semiconductor device in an upper part of FIG. 13 has a function effect similar to that in a semiconductor device in FIG. 6.

Also, as illustrated in a middle part of FIG. 13, when a single upper chip 11 and the multi-layer substrate 171 are stacked on the lower chip 12, it is also possible to apply the mold release agent 101 to an area around an area on which the multi-layer substrate 171 is stacked in an adjacent area of which the upper chip 11 is not stacked on the lower chip 12, and apply the mold release agent 101 to an upper surface and a side surface to which the multi-layer substrate 171 is not adjacent of the upper chip 11.

By configuring in this manner, it becomes possible to inhibit the generation of the stress as in the semiconductor device in the upper part of FIG. 13 as illustrated in a right end in the middle part of FIG. 13. Also, as illustrated in a left end in the middle part of FIG. 13, it becomes possible to obtain an effect similar to that in FIG. 2 or 3.

Furthermore, as for the left end in the middle part of FIG. 13, for example, by applying the mold release agent 31 to an area to which the multi-layer substrate 171 is not adjacent on the upper surface of the lower chip 12, it becomes possible to form the gap 111 between the upper surface of the lower chip 12 and the sealing resin 31 as illustrated in a lower part of FIG. 13, so that it becomes possible to obtain an effect similar to that of the semiconductor device in FIG. 6.

Figure 10:
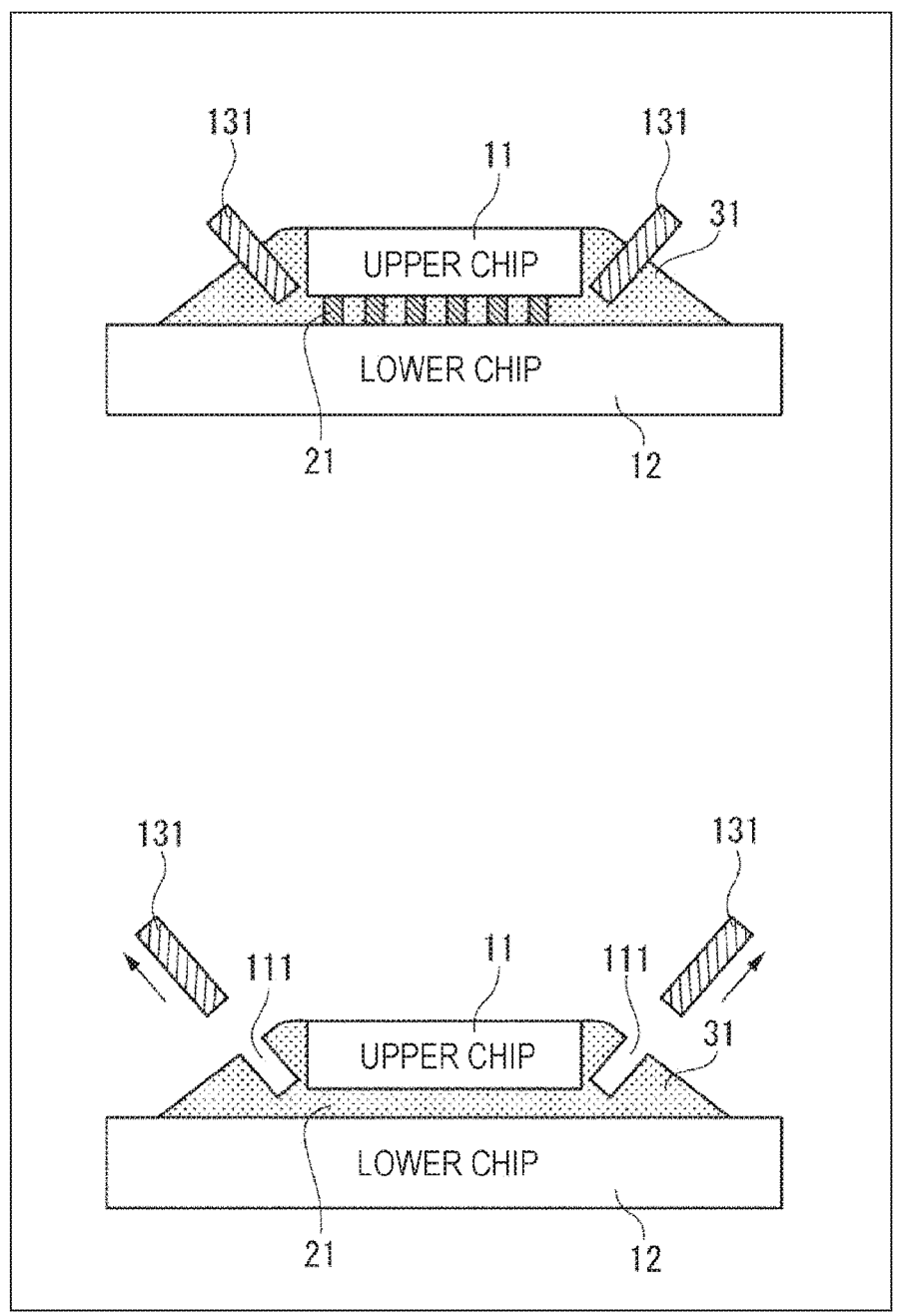
FIG. 10 is a view illustrating another example of the third variation of the semiconductor device to which the present technology is applied.

Note that, in a case in FIG. 13 also, as illustrated in FIG. 10, it is possible to form a partition plate 131 in a predetermined direction with respect to a direction of the stress generated by the sealing resin 31 and apply the sealing resin 31, and thereafter remove the partition plate 131 to form the gap 111. Also, in the lower part of FIG. 13, the upper chip 11 on a left side of the drawing may be that obtained by stacking a plurality of upper chips 11 through the bumps 21. Furthermore, when a plurality of upper chips 11, a plurality of multi-layer substrates 171 and the like are connected through the bumps 21 on the same lower chip 12, various configurations such as a processor and a memory may be used as functions of the upper chip 11 and the multi-layer substrate 171. For example, by providing the processor and the memory on the same lower chip 12 to connect, it becomes possible to decrease an arranging distance, and as a result, low impedance may be realized, so that it becomes possible to decrease heating temperature and improve a processing speed.

As described above, in the present technology, the gap at a predetermined angle with respect to the direction in which the stress is generated is formed on the fillet-shaped sealing resin on the side surface of the upper chip or an area other than an area opposed to the upper chip of the lower chip, so that the warpage of the upper chip and the lower chip is decreased, occurrence of cracking of the upper chip and the lower chip associated with the warpage is inhibited, and it becomes possible to realize the semiconductor device having higher reliability.

Also, it is possible to inhibit the occurrence of the warpage without forming a sunken portion or a groove on the lower chip, so that a decrease in strength of the semiconductor device for inhibiting the warpage is inhibited.

Furthermore, it becomes possible to inhibit the warpage regardless of a material of the sealing resin.

Note that the embodiments of the present technology are not limited to the above-described embodiments and various modifications may be made without departing from the scope of the present technology.

Also, each step described in the above-described flowchart may be executed by one device or shared to be executed by a plurality of devices.

Furthermore, when a plurality of processes is included in one step, a plurality of processes included in one step may be executed by one device or shared to be executed by a plurality of devices.

Note that the present technology may also have a following configuration.

(1) A semiconductor device including:
an upper semiconductor chip;
a lower semiconductor chip;
a bump which connects the upper semiconductor chip to the lower semiconductor chip;
a sealing resin which protects the bump; and
a gap formed between a fillet-shaped area protruding from an area in which the bump is present of the sealing resin and any one of a side surface of the upper semiconductor chip and an upper surface of the lower semiconductor chip.

(2) The semiconductor device according to (1), wherein the gap is formed by arranging a partition plate in a position between the fillet-shaped area protruding from the area in which the bump is present when the sealing resin is applied and any one of the side surface of the upper semiconductor chip and the upper surface of the lower semiconductor chip before applying the sealing resin, applying the sealing resin, and thereafter removing the partition plate.

(3) The semiconductor device according to (2), wherein the partition plate is a plate-like member to a portion in contact with the sealing resin of which a mold release agent is applied or a plate-like member formed of a material evaporated or sublimed by heat when the sealing resin is dried.

(4) The semiconductor device according to (1), wherein the gap is formed between the side surface of the upper semiconductor chip and the fillet-shaped sealing resin.

(5) The semiconductor device according to (4), wherein a mold release agent is applied to the side surface of the upper semiconductor chip, and the gap is formed when the fillet-shaped sealing resin is released from the side surface of the upper semiconductor chip by the mold release agent applied to the side surface of the upper semiconductor chip.

(6) The semiconductor device according to (5), wherein the mold release agent is applied to an upper surface in addition to the side surface of the upper semiconductor chip.

(7) The semiconductor device according to (1), wherein the gap is formed between the upper surface of the lower semiconductor chip in an area other than an area opposed to the upper semiconductor chip and the fillet-shaped sealing resin.

(8) The semiconductor device according to (7), wherein a mold release agent is applied to the upper surface of the lower semiconductor chip in the area other than the area opposed to the upper semiconductor chip, and the gap is formed when the fillet-shaped sealing resin is released from the upper surface of the lower semiconductor chip in the area other than the area opposed to the upper semiconductor chip by the mold release agent applied to the upper surface of the lower semiconductor chip in the area other than the area opposed to the upper semiconductor chip.

(9) The semiconductor device according to (1), wherein a plurality of upper semiconductor chips is stacked in a state of being connected to each other by bumps and connected to the lower semiconductor chip through the bump, and the gap is formed between the fillet-shaped sealing resin protruding from the area in which the bump is present and any one of a side surface of a plurality of stacked upper semiconductor chips and the upper surface of the lower semiconductor chip.

(10) The semiconductor device according to (1), wherein a first configuration obtained by stacking a plurality of upper semiconductor chips and a second configuration formed of the upper semiconductor chip, the configuration different from the first configuration in adjacent positions are connected to the lower semiconductor chip through bumps, and the gap is formed in an area in which the first configuration and the second configuration are not adjacent to each other, formed between the fillet-shaped sealing resin protruding from the area in which the bump is present and any one of a side surface of the first configuration and the upper surface of the lower semiconductor chip, and between the sealing resin and any one of a side surface of the second configuration and the upper surface of the lower semiconductor chip.

(11) A method of manufacturing a semiconductor device including:
an upper semiconductor chip;
a lower semiconductor chip;
a bump which connects the upper semiconductor chip to the lower semiconductor chip;
a sealing resin which protects the bump; and
a gap formed between a fillet-shaped area protruding from an area in which the bump is present of the sealing resin and any one of a side surface of the upper semiconductor chip and an upper surface of the lower semiconductor chip, the method wherein
a process for forming the gap is performed before the sealing resin is applied.

(12) The method of manufacturing the semiconductor device according to (11), wherein
the process for forming the gap is a process of arranging a partition plate in a position between the fillet-shaped area protruding from the area in which the bump is present when the sealing resin is applied and any one of the side surface of the upper semiconductor chip and the upper surface of the lower semiconductor chip, and
the partition plate is removed after the sealing resin is applied.

(13) The method of manufacturing the semiconductor device according to (12), wherein
the partition plate is a plate-like member to a portion in contact with the sealing resin of which a mold release agent is applied or a plate-like member formed of a material evaporated or sublimed by heat when the sealing resin is dried.

(14) The method of manufacturing the semiconductor device according to (11), wherein
the process for forming the gap is a process of applying a mold release agent to the side surface of the upper semiconductor chip.

(15) The method of manufacturing the semiconductor device according to (11), wherein
the process for forming the gap is a process of applying a mold release agent to the upper surface of the lower semiconductor chip in an area which is not opposed to the upper semiconductor chip.

REFERENCE SIGNS LIST

11 Upper chip
12 Lower chip
21 Bump
31 Sealing resin
101 Mold release agent
111 Gap
131 Partition plate
151 Groove
171 Multi-layer substrate

The invention claimed is:

1. A semiconductor device, comprising:
an upper semiconductor chip;
a lower semiconductor chip;
a plurality of bumps which connect the upper semiconductor chip to the lower semiconductor chip; and
a sealing resin which covers the plurality of bumps such that a plurality of gaps are present above the lower semiconductor chip, wherein:
the plurality of gaps comprises a first gap, a second gap, a third gap, and a fourth gap,
the first gap is between a first fillet-shaped area that protrudes in a first direction from a first area of the sealing resin and an entire left side surface of the upper semiconductor chip, the second gap is between the first fillet-shaped area and a left upper surface of the lower semiconductor chip, the third gap is between a second fillet-shaped area that protrudes in a second direction from the first area of the sealing resin and an entire right side surface of the upper semiconductor chip, and the fourth gap is between the second fillet-shaped area and a right upper surface of the lower semiconductor chip.

2. The semiconductor device according to claim 1, further comprising a partition plate for creation of each gap of the plurality of gaps by:

an insert operation for insertion of the partition plate, before application of the sealing resin, at a position between:
one of the first fillet-shaped area or the second fillet-shaped area, and
one of the entire left side surface of the upper semiconductor chip or the left upper surface of the lower semiconductor chip, an apply operation for the application of the sealing resin, and a removal operation for removal of the partition plate from the position.

3. The semiconductor device according to claim 2, wherein the partition plate is a plate-like member in contact with the sealing resin, and the plate-like member comprises one of a mold release agent, an evaporated material, or a heat sublimed material.

4. The semiconductor device according to claim 1, wherein:

the entire left side surface of the upper semiconductor chip and the entire right side surface of the upper semiconductor chip comprise a mold release agent, and creation of the plurality of gaps is based on at least one of a first fillet-shaped sealing resin and a second fillet-shaped sealing resin that releases from at least one of the entire left side surface, or the entire right side surface of the upper semiconductor chip by the mold release agent.

5. The semiconductor device according to claim 4, wherein the left upper surface, the right upper surface, and the entire left side surface comprise the mold release agent.

6. The semiconductor device according to claim 1, wherein the left upper surface is in a first horizontal area, and the right upper surface is in a second horizontal area, the first horizontal area and the second horizontal area are parallel to the upper semiconductor chip, and the left upper surface and the right upper surface comprise a mold release agent.

7. A semiconductor device, comprising:

a plurality of first upper semiconductor chips;

a second upper semiconductor chip different from the plurality of first upper semiconductor chips; and a lower semiconductor chip, wherein the plurality of first upper semiconductor chips and the second upper semiconductor chip are in contact with the lower semiconductor chip through a plurality of bumps such that a plurality of gaps is present on the lower semiconductor chip;

a first mold release agent in contact with an upper surface of the lower semiconductor chip; and a second mold release agent in contact with an entire side surface of the second upper semiconductor chip and an upper surface of the second upper semiconductor chip, wherein a first gap of the plurality of gaps is between a first fillet-shaped sealing resin, that protrudes in a first direction from an area in which the plurality of bumps is present, and the upper surface of the lower semiconductor chip, and a second gap of the plurality of gaps is between a second fillet-shaped sealing resin, that protrudes in a second direction opposite to the first direction, and the entire side surface of the second upper semiconductor chip.

* * * * *